US012751124B2

(12) United States Patent
Chuang et al.

(10) Patent No.: US 12,751,124 B2
(45) Date of Patent: Sep. 29, 2026

(54) DIE BONDING STRUCTURE AND METHOD OF MANUFACTURING THE SAME

(71) Applicant: AG MATERIALS TECHNOLOGY CO., LTD., Hsinchu City (TW)

(72) Inventors: Tung-Han Chuang, Hsinchu City (TW); Hsing-Hua Tsai, Hsinchu City (TW); Chung-Hsin Chou, Hsinchu City (TW)

(73) Assignee: AG MATERIALS TECHNOLOGY CO., LTD., Hsinchu City (TW)

( * ) Notice: Subject to any disclaimer, the term of this patent is extended or adjusted under 35 U.S.C. 154(b) by 291 days.

(21) Appl. No.: 18/584,050

(22) Filed: Feb. 22, 2024

(65) Prior Publication Data

US 2025/0140733 A1 May 1, 2025

(30) Foreign Application Priority Data

Oct. 30, 2023 (TW) ................................ 112211673

(51) Int. Cl.
*H10H 20/857* (2025.01)
*H10W 40/25* (2026.01)
(Continued)

(52) U.S. Cl.
CPC ........ *H10H 20/857* (2025.01); *H10W 40/258* (2026.01); *H10W 70/66* (2026.01);
(Continued)

(58) Field of Classification Search
CPC .. H10H 20/857; H10W 40/258; H10W 70/66; H10W 70/692; H10W 72/07331;
(Continued)

(56) References Cited

U.S. PATENT DOCUMENTS

2022/0259754 A1* 8/2022 Chen ...................... C25D 5/617
2023/0090030 A1* 3/2023 Chuang ................. C23C 14/025
257/782
2024/0170434 A1* 5/2024 Chuang ................. H10W 72/30

FOREIGN PATENT DOCUMENTS

TW I756106 B 2/2022
TW 202314006 A 4/2023

OTHER PUBLICATIONS

Taiwanese Office Action and Search Report for Taiwanese Application No. 112143962, dated Dec. 20, 2023.

* cited by examiner

*Primary Examiner* — Marlon T Fletcher
*Assistant Examiner* — Christina A Sylvia
(74) *Attorney, Agent, or Firm* — Birch, Stewart, Kolasch & Birch, LLP

(57) ABSTRACT

The present disclosure pertains to a die bonding structure. The die bonding structure includes a carrier substrate, a sintered layer, a nano-twinned layer, an adhesive layer and a chip. The sintered layer is located on the carrier substrate. The nano-twinned layer is located on the sintered layer, in which the surface of the nano-twinned layer has [111] crystal orientation with a density greater than 80%, in which the nano-twinned layer comprises parallel-arranged twin boundaries, the parallel-arranged twin boundaries comprise more than 40% [111] crystal orientation, and the spacing between the parallel-arranged twin boundaries is 10 to 100 nm. The adhesive layer is located on the nano-twinned layer. The chip is located on the adhesive layer.

21 Claims, 17 Drawing Sheets

(51) Int. Cl.

| | |
|---|---|
| ***H10W 70/66*** | (2026.01) |
| ***H10W 70/692*** | (2026.01) |
| *H10W 72/00* | (2026.01) |
| *H10W 72/30* | (2026.01) |
| *H10W 72/90* | (2026.01) |
| *H10W 90/00* | (2026.01) |

(52) U.S. Cl.
CPC .... *H10W 70/692* (2026.01); *H10W 72/07331* (2026.01); *H10W 72/352* (2026.01); *H10W 72/355* (2026.01); *H10W 72/952* (2026.01); *H10W 72/953* (2026.01); *H10W 90/734* (2026.01); *H10W 90/736* (2026.01)

(58) Field of Classification Search
CPC ............ H10W 72/352; H10W 72/355; H10W 72/952; H10W 72/953; H10W 90/734; H10W 90/736; H10W 72/013
See application file for complete search history.

DIE BONDING STRUCTURE AND METHOD OF MANUFACTURING THE SAME

TECHNICAL FIELD

The disclosure relates to die bonding technology, in particular, to die bonding structures with nano-twinned layers and a method of manufacturing the same.

CROSS REFERENCE TO RELATED APPLICATIONS

This application claims priority of Taiwan Patent Application No. 112211673, filed on Oct. 30, 2023, the entirety of which is incorporated by reference herein.

BACKGROUND

Description of the Related Art

In the fabrication process of power integrated circuit (IC) modules and high-power light-emitting diode (LED) packaging, there is a step to die bonding between the chip and the ceramic substrate. The existing die bonding technology includes eutectic bonding, adhesive bonding, solder bonding, and the like, which cannot withstand the high temperature operation of the chip and have poor reliability. Therefore, silver sintering and copper sintering are currently becoming more and more popular die bonding technologies, especially in electric vehicle power module packaging. However, the thermal stress generated by the high temperature of die bonding in silver sintering and copper sintering will cause extremely severe damage, so that the bonding strength is generally lower than 20 MPa.

The backside of the chip needs to be coated with a metal layer before bonding, whether it is a power IC module or high-power LED packaging. The traditional structure of the backside metal layer is Ti/Ni/Ag, in which the outermost silver layer is composed of equi-axial coarse grains, and its grain boundaries have chaotic lattice orientations.

Taiwan Patent No. 1432613 discloses a method of electroplating copper nano-twinned. Taiwan Patent No. 1703226 also discloses a method of sputtering silver nano-twinned. Taiwan Patent No. 1810631 further discloses a method of evaporating silver nano-twinned by using ion beam bombardment. These existing techniques have confirmed that high-density (111) crystal orientation of the nano-twinned layers can be obtained, and the atomic diffusion rate of (111) crystal orientation is higher than that of (100) and (110) crystal orientations by 3 to 5 orders of magnitude.

For the application of the above-mentioned method, Taiwan Patent No. 1686518 discloses a method of direct bonding at low temperatures by using copper nano-twinned. Taiwan Patent No. 1432613 further discloses a method of direct bonding between a chip and a ceramic substrate at low temperatures by using silver nano-twinned. However, the bonding interface of the existing nano-twinned direct stacking bonding technology only has a thin film structure below 10 mm, and its bonding strength is generally only 20 to 40 MPa, which raises extremely serious concerns about reliability. In the case of the die bonding between the chip and the ceramic substrate, the existing method of nano-twinned direct stacking is to directly insert the nano-twinned film between the chip and the ceramic substrate, but it easily causes cracks in the bonding interface and is still not widely used, especially for high-power automotive modules with extremely demanding requirements.

SUMMARY

An embodiment of the present disclosure provides a die bonding structure. The die bonding structure includes a carrier substrate, a sintered layer, a nano-twinned layer, an adhesive layer and a chip. The sintered layer is located on the carrier substrate. The nano-twinned layer is located on the sintered layer, in which the surface of the nano-twinned layer has crystal orientation with a density greater than 80%, in which the nano-twinned layer comprises parallel-arranged twin boundaries, the parallel-arranged twin boundaries comprise more than 40% crystal orientation, and the spacing between the parallel-arranged twin boundaries is 10 to 100 nm. The adhesive layer is located on the nano-twinned layer. The chip is located on the adhesive layer.

An embodiment of the present disclosure provides a method of manufacturing a die bonding structure. The method includes providing a chip, forming an adhesive layer on the nano-twinned layer, forming a nano-twinned layer on the sintered layer, and performing a bonding process to bond the nano-twinned layer to a carrier substrate through a sintered layer. The surface of the nano-twinned layer has [111] crystal orientation with a density greater than 80%. The nano-twinned layer comprises parallel-arranged twin boundaries. The parallel-arranged twin boundaries comprise more than 40% [111] crystal orientation. The spacing between the parallel-arranged twin boundaries is 10 to 100 nm.

BRIEF DESCRIPTION OF THE DRAWINGS

Aspects of the present disclosure are better understood from the following detailed description when read with the accompanying figures. It is worth noting that some features may not be drawn to scale in accordance with the standard practice in the industry. In fact, the dimensions of the various features may be arbitrarily increased or reduced for clarity of discussion. It is also emphasized that the drawings appended illustrate only typical embodiments of this disclosure and are therefore not to be considered limiting in scope, for the disclosure may apply equally well to other embodiments.

DETAILED DESCRIPTION

Figure 1:
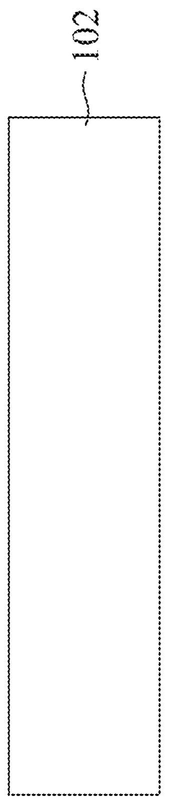
FIGS. 1-4 are cross-sectional views of various stages of manufacturing a die bonding structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including," "having," or "comprising," etc. are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The present disclosure provides a die bonding structure having a nano-twinned layer, which allows the chip to be bonded to the carrier substrate at a low temperature of about 150° C. to 350° C. to ensure the process yield and desirable bonding strength (such as higher than 20 MPa) of the power module packaging. Meanwhile, the interface cracking problem of nano-twinned direct bonding (directly inserting the nano-twinned film between the chip and the ceramic substrate) is avoided due to the existence of the sintered layer, thereby effectively improving the reliability of the packaged product. Furthermore, the adhesive layer can provide a better bonding force for preventing the nano-twinned layer from peeling from the chip and has a lattice buffering effect to reduce the impact of the lattice of the chip on the growth of the silver nano-twinned structure. In addition, undesired diffusion caused by high temperatures can be avoided, so that the diffusion barrier layer can be omitted between the adhesive layer and the nano-twinned layer while preventing the possibility of a poor bonding force between the nano-twinned layer and the diffusion barrier layer at the same time.

FIGS. 1-4 are cross-sectional views of various stages of manufacturing a die bonding structure 100, in accordance with some embodiments.

Referring to FIG. 1, in an embodiment, a chip 102 is provided. In an embodiment, the chip 102 may include a power integrated circuit (IC) chip or a light-emitting diode (LED) chip. In an embodiment, the chip 102 may include a single crystal: silicon (Si), germanium (Ge), silicon carbide (SiC), sapphire, arsenic gallium (GaAs), or gallium nitride (GaN).

Figure 2:
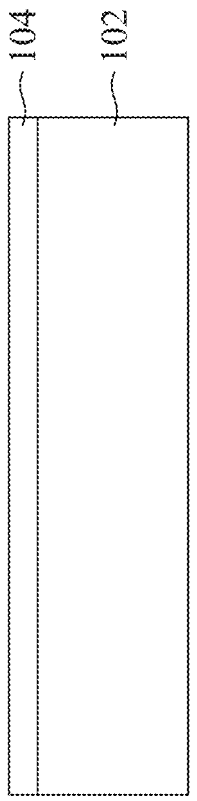

Referring to FIG. 2, in an embodiment, an adhesive layer 104 is formed on the chip 102.

Figure 3:
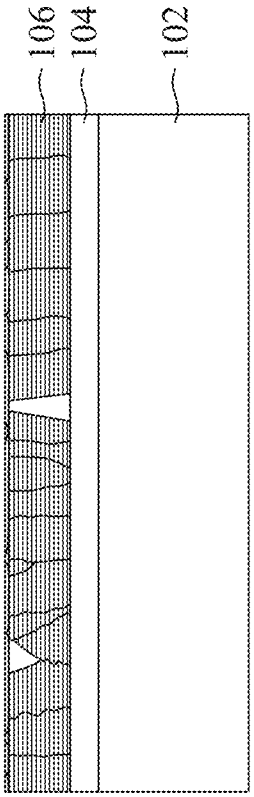

In some embodiments, the adhesive layer 104 can provide a better bonding force between the chip 102 and the nano-twinned layer 106 (as shown in FIG. 3). The die bonding structure 100 is easily cracked between the chip 102 and the nano-twinned layer 106 due to insufficient bonding force between the nano-twinned layer 106 and the chip 102. In practice, when the thickness of the nano-twinned layer 106 is greater than 2 um, the bonding force between the nano-twinned layer 106 and the chip 102 tends to significantly degrade, and the nano-twinned layer 106 is easily peeled off. To address this issue, in the present disclosure, the adhesive layer 104 is formed on the chip 102 before forming the nano-twinned layer 106 to ensure that the nano-twinned layer 106 and the chip 102 are still in contact with each other, even if the nano-twinned layer 106 is greater than 10 um.

In some embodiments, the adhesive layer 104 has a lattice buffering effect. If the nano-twinned layer 106 is formed directly on the chip 102, the crystal orientation of the nano-twinned layer 106 will be influenced by the crystal orientation of the chip 102. For example, a film formed on the chip with (100) orientation is not likely to have a (111) crystal orientation. Therefore, the nano-twinned layer 106 with a high twin density can be formed on the chip 102 with the (111) orientation, and the nano-twinned structure formed on the chip 102 with the (110) orientation has an extremely low twin density. However, the adhesive layer 104 of the present disclosure allows the nano-twinned structures formed on the chip 102 with various crystal orientations due to the lattice buffering effect. Specifically, whether the crystal orientation of the chip 102 is (100), (110), or (111), the formed nano-twinned layer 106 has more than 40% crystal orientation. It should be understood that the existence of the adhesion layer 104 not only allows the formation of the nano-twinned layer 106 with the (111) crystal orientation on the chip 102 with the above-mentioned (100), (110), or (111) orientation, but also reduces the influence of the crystal orientation of other types of chips (such as SiC, GaAs, or the like) on the crystal orientation of the subsequently deposited nano-twinned layer structure.

In an embodiment, the adhesive layer 104 may include titanium (Ti), aluminum titanium (TiAl), chromium (Cr), or titanium tungsten (TiW). In an embodiment, the thickness of the adhesive layer 104 is 0.01 um to 10 um (such as 0.02 um to 0.2 um). It should be understood that the thickness of the adhesive layer 104 can be appropriately adjusted according to practical applications, but the disclosure is not limited thereto.

In some embodiments, the adhesive layer 104 may be formed by sputtering, evaporation, or electroplating. In accordance with some embodiments, the adhesive layer 104 may be formed on the chip 102 by sputtering. In some embodiments, the sputtering may use a single sputtering gun or multiple sputtering guns. In the sputtering process, the power source may be direct current (DC), DC pulse, RF, high-power impulse magnetron sputtering (HIPIMS), or the like. The power may be, for example, about 100 W to about 200 W. The processing temperature is room temperature, but during the sputtering process, it will rise by about 50° C. to about 200° C. The background pressure of the sputtering process is less than $1\times10^{-5}$ torr. The working pressure may be, for example, about $1\times10^{-3}$ torr to about $1\times10^{-2}$ torr. The argon flow may be, for example, about 10 sccm to about 20 sccm. The rotation speed of the chuck may be, for example, about 5 rpm to about 20 rpm. The bias voltage applied to the substrate during the sputtering process is about −100V to about −200V. The deposition rate of the adhesive layer 104 may be, for example, about 0.5 nm/s to about 3 nm/s. It should be understood that the sputtering process parameters described above may be appropriately adjusted according to practical applications, and the disclosure is not limited thereto.

In accordance with other embodiments, the adhesive layer 104 may be formed on the chip 102 by evaporation coating. The background pressure of the evaporation coating process is less than $1\times10^{-5}$ torr, and the working pressure of the process may be, for example, about $1\times10^{-4}$ torr to about $5\times10^{-4}$ torr. The argon flow may be about 2 sccm to about 10 sccm. The rotation speed of the chuck may be, for example, about 5 rpm to about 20 rpm. The evaporation coating rate of the adhesive layer 104 may be, for example, about 1 nm/s to about 5 nm/s. It should be understood that the evaporation coating process parameters described above may be appropriately adjusted according to practical applications, and the disclosure is not limited thereto.

Referring to FIG. 3, in an embodiment, a nano-twinned layer 106 is formed on the adhesive layer 104. The surface of the nano-twinned layer 106 has crystal orientation with a density greater than 80% (such as greater than 85% or greater than 90%). The nano-twinned layer 106 includes parallel-arranged twin boundaries, which include more than 40% (such as more than 50% or more than 60%) [111] crystal orientation, and the spacing between the parallel-arranged twin boundaries is 10 nm to 100 nm (such as 20 nm to 30 nm).

The formation of a twin structure is due to the accumulated strain energy inside a material. The strain energy drives uniform atomic shear to unsheared atoms at some regions inside the grain to form lattice positions that are mirror-symmetrical to each other. The twins may be annealing twins or mechanical twins. The mutually symmetrical interface is the twin boundary.

Twins are mainly formed in face centered cubic (FCC) or hexagonal closed-packed (HCP) crystalline materials with the closest lattice arrangement. In addition to the crystal structure with the closest lattice arrangement, twins are more likely formed in materials with small stacking fault energy.

Twin boundaries are coherent crystal structures and are classified as Σ3 and Σ9 special grain boundaries with low interfacial energy. The crystal orientations are all {111}. Compared with high-angle grain boundaries formed by general annealing and recrystallization, the interfacial energy of twin boundaries is about 5% of the interfacial energy of high-angle grain boundaries (George E. Dieter, Mechanical Metallurgy, MCGRAW-HILL Book Company, 1976, P. 135-141).

Due to the low interfacial energy of the twin boundaries, oxidation, sulfurization, and chloride ion corrosion may be avoided. Therefore, the silver nano-twinned thin film exhibits better resistance to oxidation and corrosion. In addition, the symmetrical lattice arrangement of twins is less likely to impede electron transportation. Therefore, the silver nano-twinned thin film exhibits better electrical and thermal conductivity. Because the twin boundaries inhibit the movement of dislocation, materials may still maintain high tensile strength. The characteristics of high tensile strength and electrical conductivity have been proven in the copper thin film. (See Ultrahigh Strength and High Electrical Conductivity in Copper, Science, vol. 304, 2004, p. 422-426 issued to L. Lu, Y. Shen, X. Chen, L. Qian, and K. Lu).

In terms of high-temperature stability, twin boundaries are more stable than high-angle grain boundaries due to the low interfacial energy of twin boundaries. Twin boundaries are less likely to move at high temperatures. Twin boundaries may have an effect on locking surrounding high-angle grain boundaries, making the high-angle grain boundaries unable to move. Therefore, the grains may not grow significantly at high temperatures, which enable the tensile strength of the material to be maintained at high temperatures.

In terms of current reliability, since atoms have a low diffusion rate when passing through twin boundaries with low interfacial energy, it is difficult to move atoms inside the wire at a high current density during operation of electronic devices. As such, the electromigration that often occurs when current passes through a wire is inhibited. It has been proven that twins can inhibit electromigration in copper thin film. (See Observation of Atomic Diffusion at Twin-Modified Grain Boundaries in Copper, Science, vol. 321, 2008, p. 1066-1069 issued to K. C. Chen, W. W. Wu, C. N. Liao, L. J. Chen, and K. N. Tu).

In an embodiment, the nano-twinned layer 106 may include silver, copper, or a silver-copper alloy. In an embodiment, the thickness of the nano-twinned layer 106 is 0.1 um to 100 um (such as 0.5 um to 10 um). If the thickness of the nano-twinned layer 106 is less than 0.1 um, the nano-twinned layer 106 may quickly react with the bonding material and is completely consumed during the subsequent bonding process, and an interfacial intermetallic compound thus formed cannot be bonded to the chip 102, resulting in interface detachment, rendering it impractical for applications. On the other hand, if the thickness of the nano-twinned layer 106 is greater than 100 um, the nano-twinned layer 106 is easily peeled from the adhesive layer 104 located on the chip 102.

In some embodiments, the nano-twinned layer 106 may be formed by sputtering, evaporation or electroplating. In accordance with some embodiments, the sputtering may use a single sputtering gun or multiple sputtering guns. In the sputtering process, the power source may be direct current (DC), DC pulse, RF, or high-power impulse magnetron sputtering (HIPIMS). The power of the sputtering of the nano-twinned layer 106 may be, for example, about 100 W to about 500 W. The processing temperature is room temperature, but during the sputtering process, it will rise by about 50° C. to about 200° C. The deposition rate of the nano-twinned layer 106 may be, for example, about 0.5 nm/s to about 3 nm/s. The background pressure of the sputtering process is less than $1\times10^{-5}$ torr. The working pressure may be, for example, about $1\times10^{-3}$ torr to about $1\times10^{-2}$ torr. The argon flow may be, for example, about 10 sccm to about 20 sccm. The rotation speed of the chuck may be, for example, 5 rpm to 20 rpm. The bias voltage applied to the substrate during the sputtering process is about −100V to about −200V. It should be understood that the sputtering process parameters described above may be appropriately adjusted according to practical applications, and the disclosure is not limited thereto.

In accordance with other embodiments, the nano-twinned layer 106 may be formed on the adhesive layer 104 by evaporation coating. In some embodiments, the background pressure of the evaporation coating process is less than $1\times10^{-5}$ torr, and the working pressure of the process may be, for example, about $1\times10^{-4}$ torr to about $5\times10^{-4}$ torr. The argon flow may be about 2 sccm to about 10 sccm. The rotation speed of the chuck may be, for example, about 5 rpm to about 20 rpm. The evaporation coating rate of the nano-twinned layer 106 may be, for example, about 1 nm/s to about 5 nm/s. During the evaporation process, ion bombardment is applied to the nano-twinned layer 106. The voltage is about 10V to about 300V, and the current is about 0.1 A to about 1.0 A. It should be understood that the evaporation coating process parameters described above may be appropriately adjusted according to practical applications, and the disclosure is not limited thereto.

Figure 4:
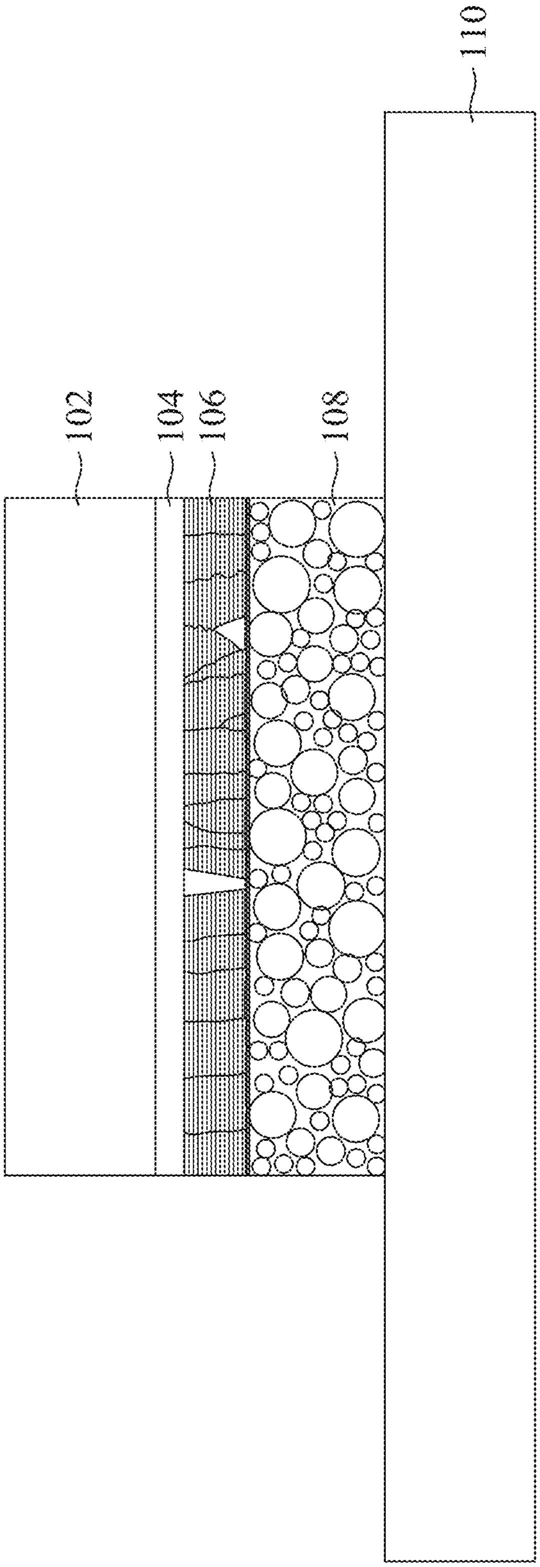

Referring to FIG. 4, in an embodiment, a bonding process is performed to bond the nano-twinned layer 106 to a carrier substrate 110 through a sintering layer 108. As shown in the figure, the chip 102, the adhesive layer 104, and the nano-twinned layer 106 (as shown in FIG. 3) are flipped and stacked on the carrier substrate 110 (as shown in FIG. 4) through the sintering layer 108, and die bonding is then performed. In an embodiment, the die bonding structure 100 includes a carrier substrate 110, a sintered layer 108 located on the carrier substrate 110, a nano-twinned layer 106 located on the sintered layer 108, an adhesive layer 104 located on the nano-twinned layer 106, and the chip 102 located on the adhesive layer 104.

In an embodiment, the bonding process may include, first disposing the sintering material on the carrier substrate 110, bonding the nano-twinned layer 106 to the sintering material, and heating the sintering material to form the sintered layer 108, but the present disclosure is not limited thereto. In other embodiments, the bonding process may include, first disposing the sintering material on the nano-twinned layer 106, bonding the carrier substrate 110 to the sintering material, and heating the sintering material to form the sintered layer 108.

In some embodiments, the sintered layer 108 can be used as a buffer to prevent interface cracks caused by the direct bonding of the nano-twinned layer 106 and the carrier substrate 110, thereby effectively improving the reliability of the packaged product. In an embodiment, the sintering material may include a silver paste, a copper paste, or a copper paste covered with silver to result in a sintered layer 108 including silver, copper, or a silver-copper composite, respectively, after heating and sintering.

In an embodiment, the carrier substrate 110 may include a metal heat sink, and the metal heat sink may include aluminum or copper. In another embodiment, the carrier substrate 110 may include a printed circuit board (PCB) having a copper circuit layer and a protective layer thereon, or a ceramic substrate having the copper circuit layer and the protective layer thereon. In some embodiments, the protective layer is located on the copper circuit layer to prevent the copper circuit layer from rusting (sulfidation or oxidation) due to exposure to the atmosphere. In an embodiment, the protective layer may include an organic solderability preservative (OSP) or a metal film such as Ni, Ni/Pd, Ni/Au, Ni/Pd/Au, or the like. In an embodiment, the ceramic substrate may include aluminum oxide ($Al_2O_3$), aluminum nitride (AlN), or silicon nitride ($Si_3N_4$).

The bonding process can be performed under vacuum, a protective atmosphere, or an ambient atmosphere. In some embodiments, the bonding process is performed under a pressure of 5 MPa to 30 MPa (such as 10 MPa to 25 MPa or 15 MPa to 20 MPa) and at a temperature of 100° C. to 350° C. (such as 100° C. to 250° C., 150° C. to 200° C., or 120° C. to 180° C.). Such a pressure range can prevent damage to both the chip 102 and the nano-twinned layer 106. Although the existing techniques can perform the bonding process under a low pressure of 0.8 MPa to 3 MPa, it is necessary to perform chemical mechanical polishing (CMP) on the nano-twinned thin film before bonding to reduce the surface roughness, which not only complicates the process but also destroys the nano-twinned thin film. Under the premise of not damaging the chip 102 and the nano-twinned layer 106, the present disclosure applies a pressure of about 5 MPa to about 30 MPa (which is higher than the existing techniques) to make the protruding surface structure of the nano-twinned layer 106 undergo nano-level plastic deformation to achieve close contact. It not only solves the surface roughness problem of the nano-twinned layer 106 but also eliminates the need for additional complicated chemical mechanical polishing steps in existing techniques, which greatly improves throughput and yield, and the disclosure is not limited thereto. In other embodiments, the die bonding structure 100 can be bonded without the application of pressure.

Figure 5:
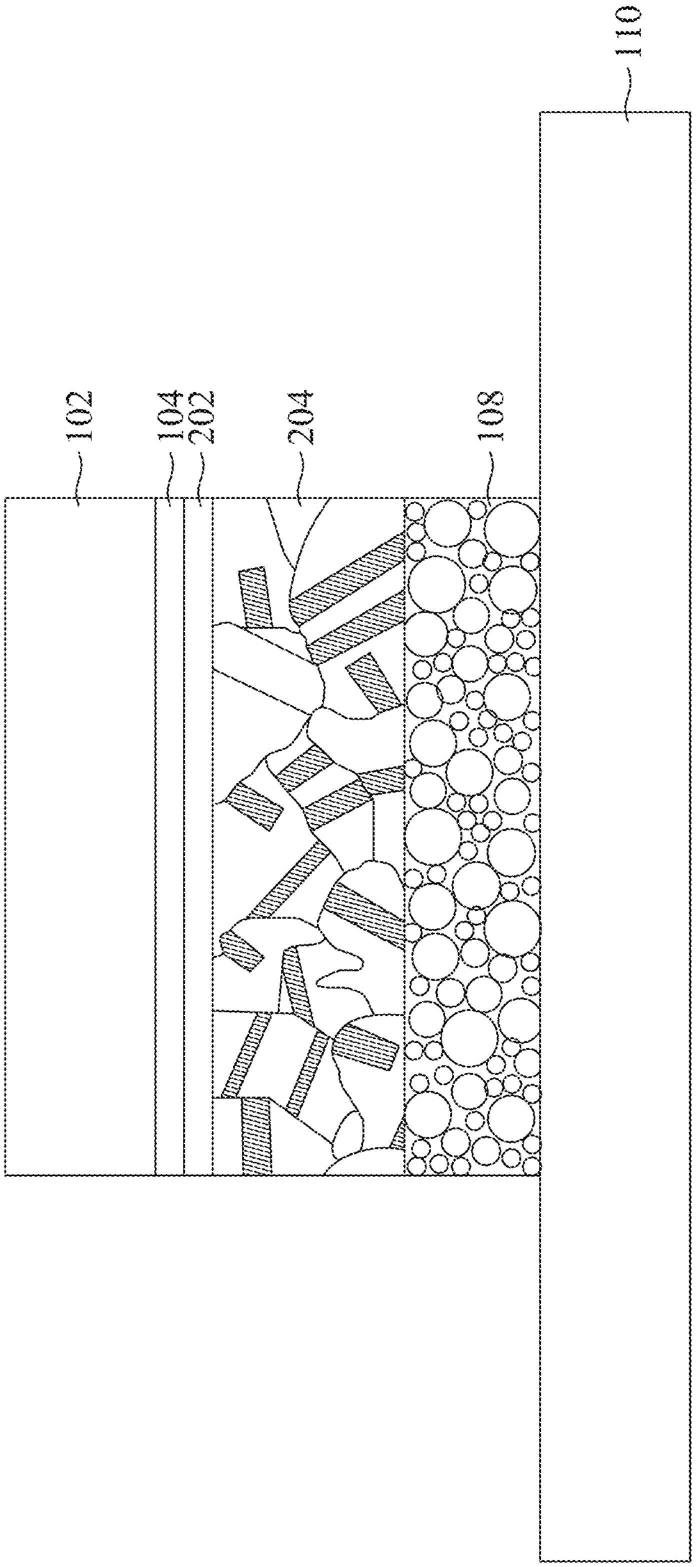
FIG. 5 is a cross-sectional view of a die bonding structure, in accordance with a comparative embodiment.

FIG. 5 is a cross-sectional view of a die bonding structure 200, in accordance with a comparative embodiment. The die bonding structure 200 is similar to the die bonding structure 100 in FIG. 4, except that the die bonding structure 200 has a diffusion barrier layer 202 and an equi-axial coarse grain layer 204 rather than the nano-twinned layer 106 between the adhesive layer 104 and the sintering layer 108. In the comparative embodiment, in order to prevent the equi-axial coarse grain layer 204 from diffusing toward the chip 102 or the adhesive layer 104 from diffusing toward the equi-axial coarse grain layer 204 during the high temperature bonding process, inserting a diffusion barrier layer 202 between the adhesion layer 104 and the sintering layer 108 is necessary. In addition, the equi-axial coarse grain layer 204 (such as silver) does not react with the diffusion barrier layer 202 (such as nickel) at their interface and thus adversely affects the bonding force between them.

Referring back to FIG. 4, in an embodiment, the adhesion layer 104 is in direct contact with the nano-twinned layer 106. In other words, there is an absence of a diffusion barrier layer 202 between the adhesion layer 104 and the nano-twinned layer 106. If the nano-twinned layer 106 exists between the chip 102 and the carrier substrate 110, a low-temperature bonding process can be performed while avoiding undesired diffusion caused by high temperatures.

Therefore, mutual diffusion can be avoided without the diffusion barrier layer 202 between the adhesion layer 104 and the nano-twinned layer 106, while preventing poor bonding forces between the nano-twinned layer 106 and the diffusion barrier layer 202, and the disclosure is not limited thereto. In other embodiments, the die bonding structure 100 may include the diffusion barrier layer 202 if needed.

Test results of Examples and Comparative Examples of the die bonding structures of the present disclosure are described below.

Comparative Example 1: SiC/Cr/Ni/Ag Structure

Figure 6:
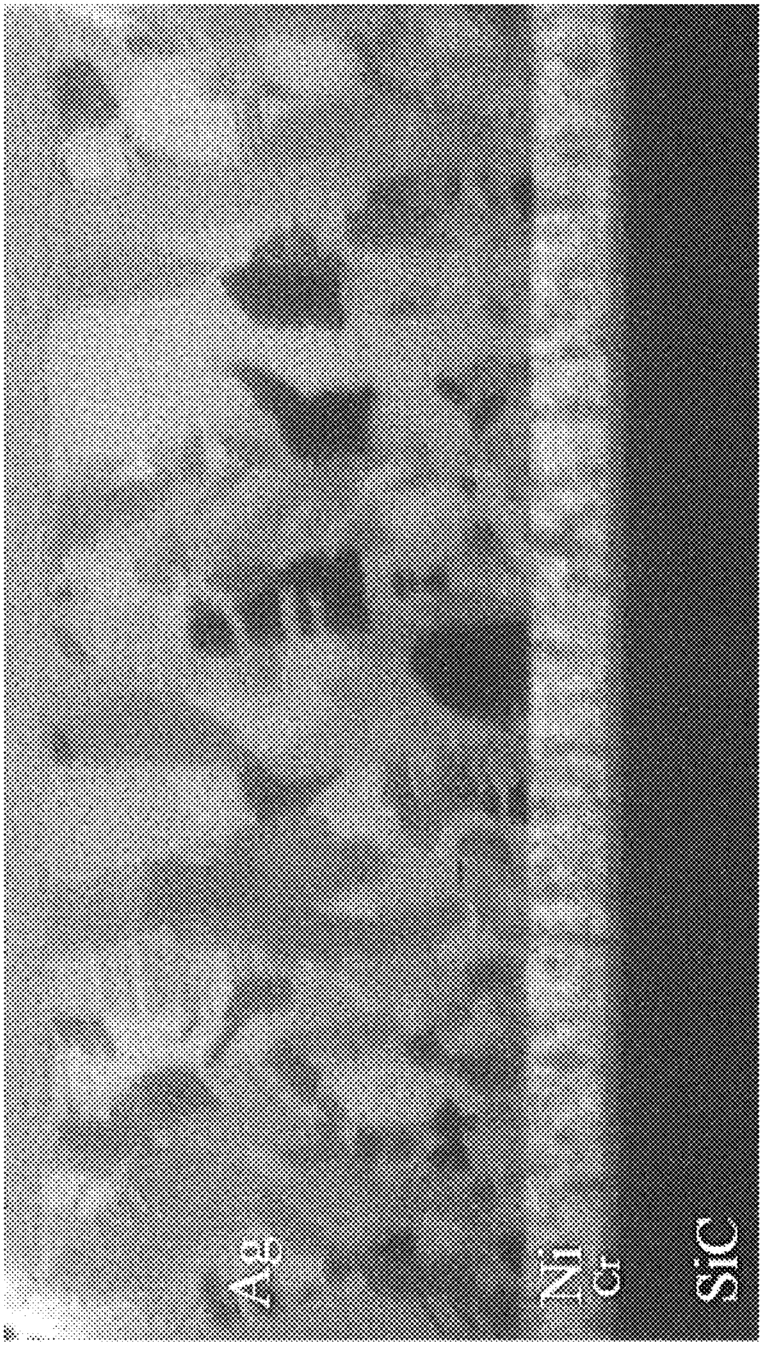
FIG. 6 is a focused ion beam (FIB) image showing a cross-sectional view of a SiC/Cr/Ni/Ag structure.

FIG. 6 is a focused ion beam (FIB) image showing a cross-sectional view of a SiC/Cr/Ni/Ag structure. The SiC/Cr/Ni/Ag structure is an example of the die bonding structure 200 in FIG. 5, in which the chip 102 was silicon carbide (SiC), the adhesive layer 104 was chromium (Cr), the diffusion barrier layer 202 was nickel (Ni), and the equi-axial coarse grain layer 204 was silver (Ag).

Example 1: SiC/Cr/Nt-Ag Structure

Figure 7:
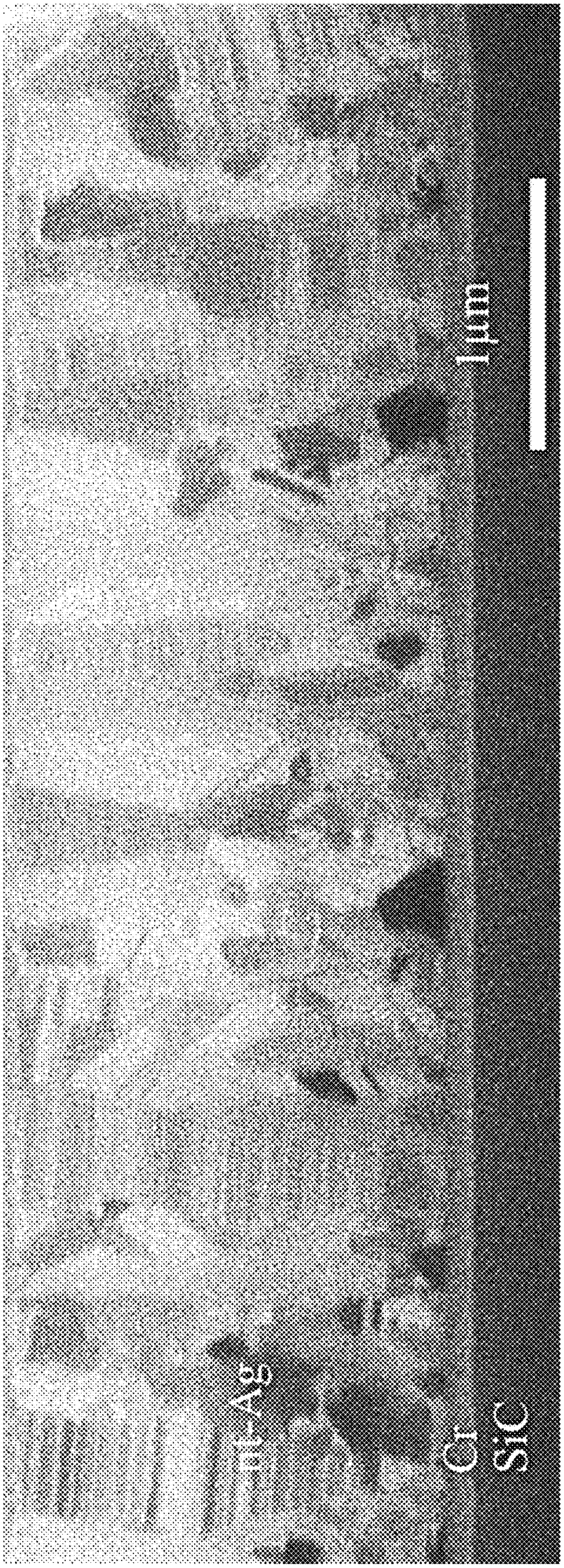
FIG. 7 is a FIB image showing a cross-sectional view of a SiC/Cr/nt-Ag structure, in accordance with some embodiments.

FIG. 7 is a FIB image showing a cross-sectional view of a SiC/Cr/nt-Ag structure, in accordance with some embodiments. The SiC/Cr/nt-Ag structure is an example of the die bonding structure 100 in FIG. 4, in which the chip 102 was silicon carbide (SiC), the adhesion layer 104 was chromium (Cr), and the nano-twinned layer 106 was silver (Ag). The term "nt-Ag" used herein refers to silver nano-twinned (nt).

The structures of Comparative Example 1 and Example 1 as described above were respectively bonded with the silver paste (as the sintering layer 108) and the direct bond copper (DBC) ceramic substrate in a vacuum, and the sintering was performed under a pressure of 10 MPa or without applying pressure at various bonding temperatures (such as 150° C., 180° C., and 225° C.).

Figure 8:
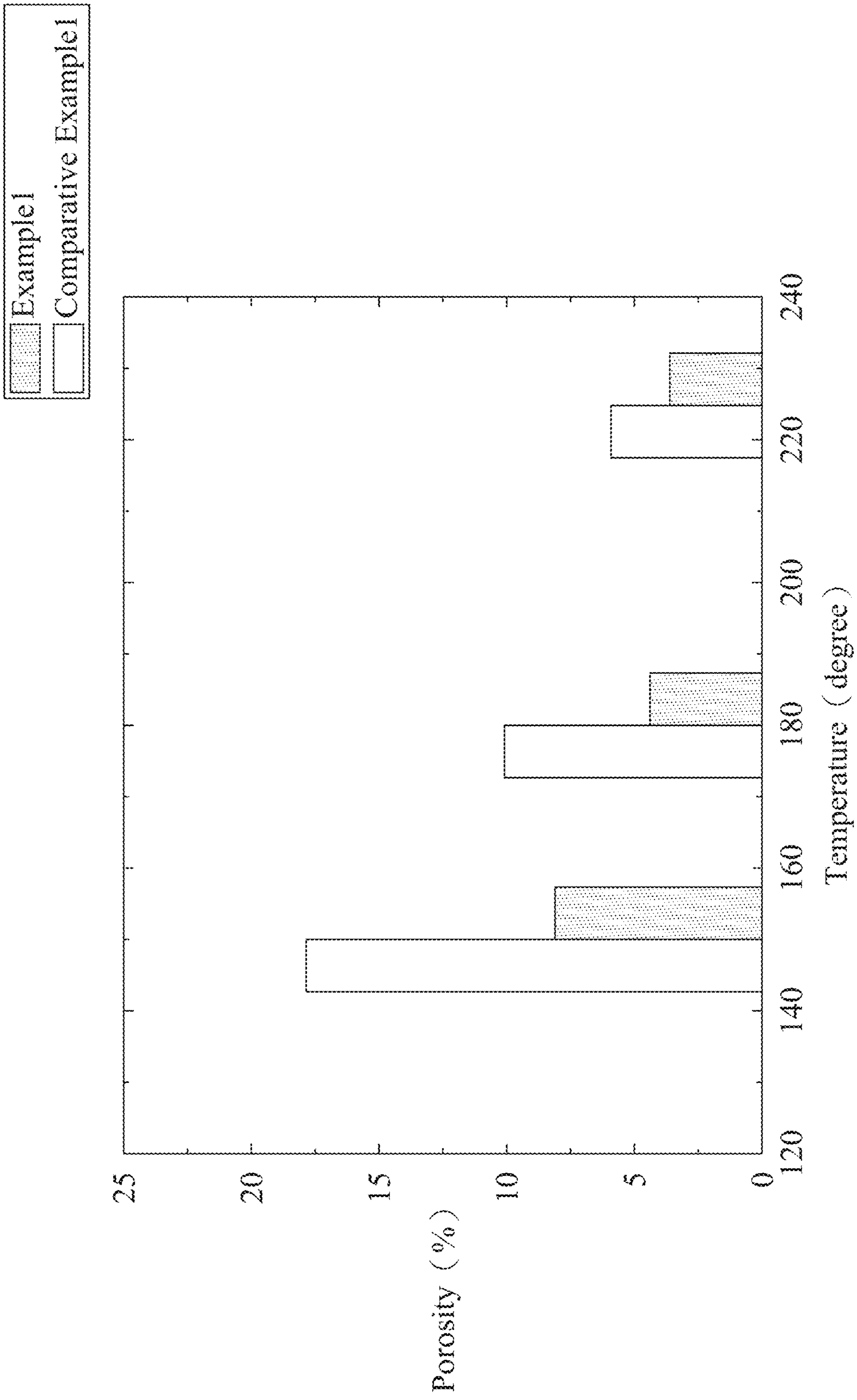
FIGS. 8-9 are diagrams showing binding temperature versus porosity of Ag sintered joints, in accordance with some embodiments.
Figure 9:
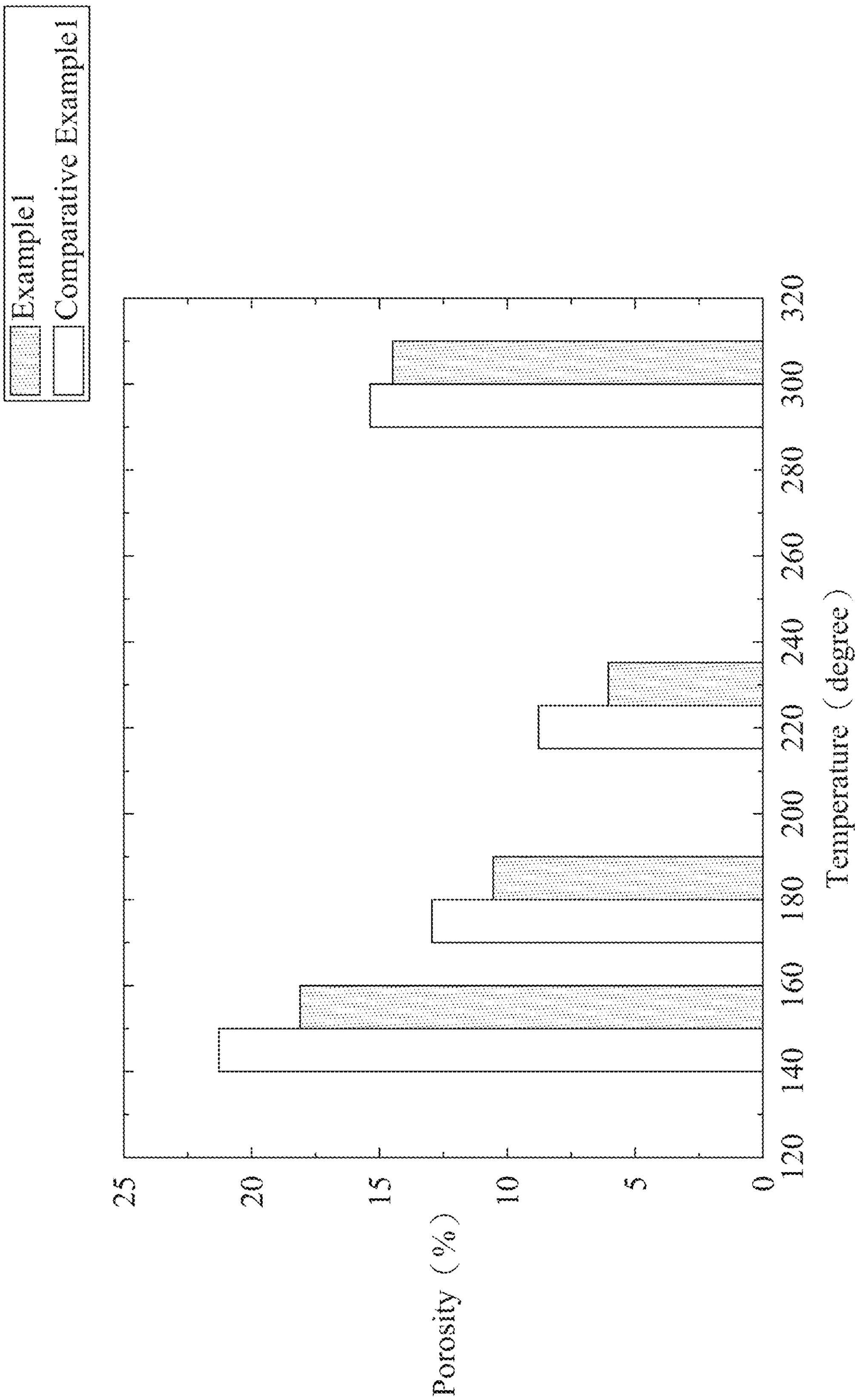

As shown in FIG. 8 (applying pressure of 10 MPa) and FIG. 9 (without applying pressure), Example 1 obviously reduces the porosity of Ag sintered joints compared to Comparative Example 1. For the die bonding at 225° C. without external pressure, the porosity decreased from 8.6% to 6.5%. Surprisingly, the Ag sintered porosity can be reduced to an extremely low value of 7.8% after die bonding even at a low temperature of 150° C. with 10 MPa applied pressure by using the nano-twinned layer 106.

[Bonding Strength Measurement]

After die bonding, the bonding strength was measured using a welding strength tester (DAGE 4000), manufactured by Nordson. The results with the application of 10 MPa of pressure are shown in Table 1 and FIG. 10, while the results without pressure applied are shown in Table 2 and FIG. 11.

TABLE 1

| | Bonding strength (MPa) | | |
|---|---|---|---|
| Temperature | 150° C. | 180° C. | 225° C. |
| Comparative Example 1 | 10.50 | 21.67 | 31.07 |
| Example 1 | 33.10 | 38.60 | 45.20 |

TABLE 2

| | Bonding strength (MPa) | | | |
|---|---|---|---|---|
| Temperature | 150° C. | 180° C. | 225° C. | 300° C. |
| Comparative Example 1 | 10.17 | 19.67 | 26.07 | 12.80 |
| Example 1 | 12.57 | 21.60 | 28.20 | 16.00 |

Figure 10:
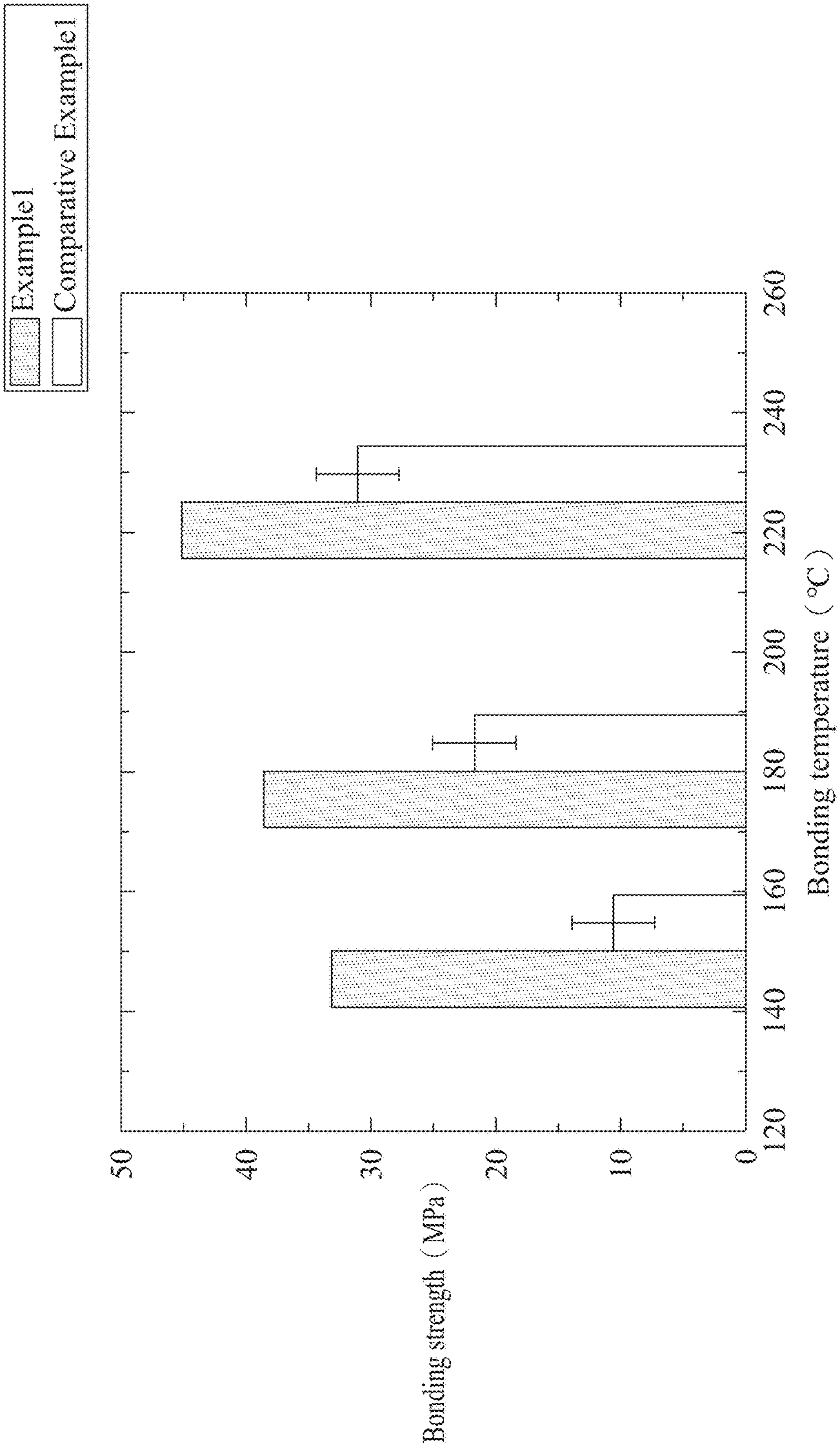
FIGS. 10-11 are diagrams showing binding temperature versus bonding strength, in accordance with some embodiments.
Figure 11:
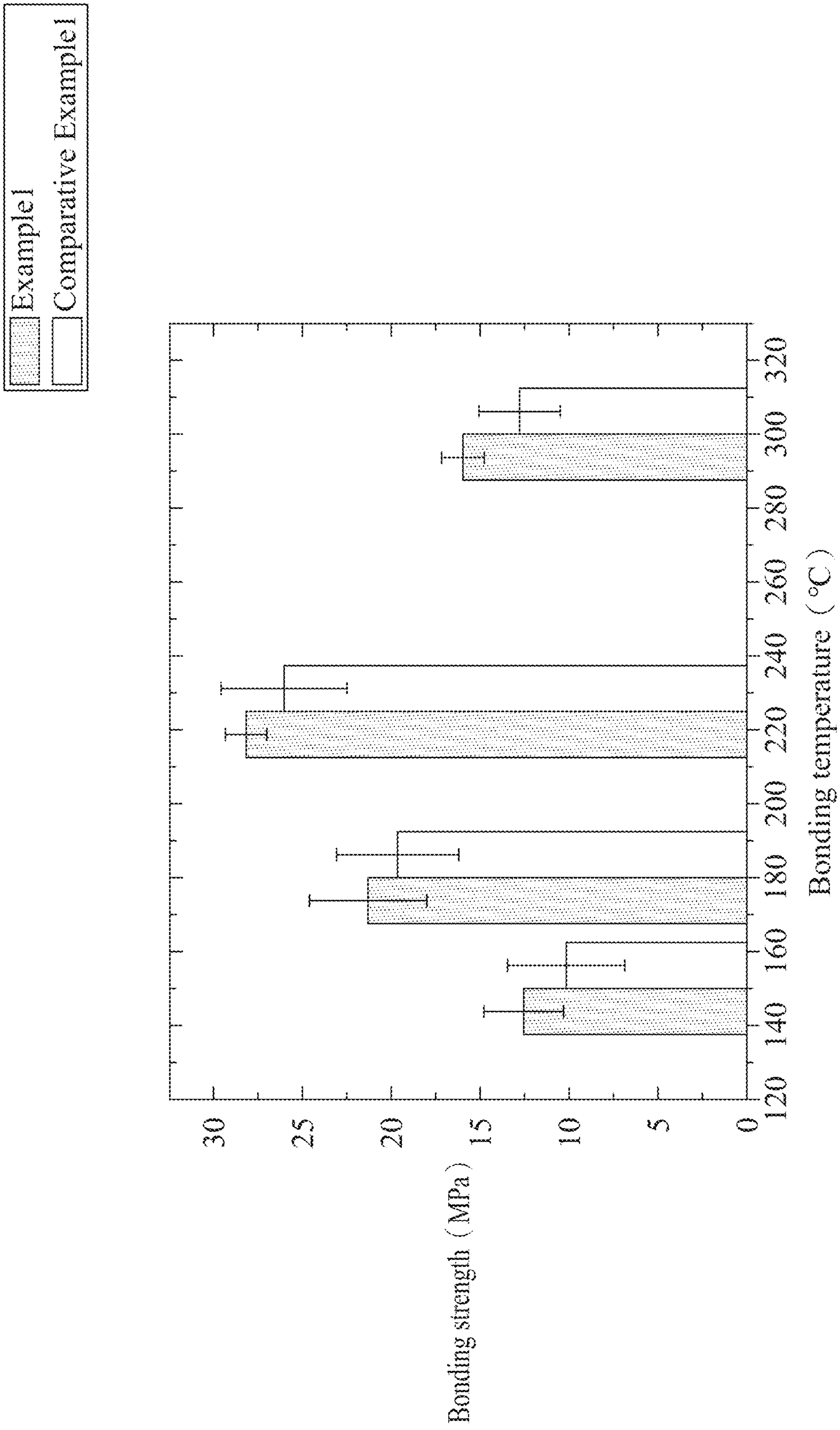

According to Table 1, Table 2, FIG. 10, and FIG. 11, after sintering at various bonding temperatures (such as 150° C., 180° C., 225° C., and 300° C.) in a vacuum, Example 1 (SiC/Cr/nt-Ag) had better bonding strength than Comparative Example 1 (SiC/Cr/Ni/Ag), whether a pressure of 10 MPa was applied or not. In other words, the die bonding structure 100 with the nano-twinned layer 106 has better bonding strength than the die bonding structure 200 with the equi-axial coarse grain layer 204 under various bonding temperatures and conditions.

Comparative Example 2: SiC/Ti/Ni/Ag Structure

Figure 12:
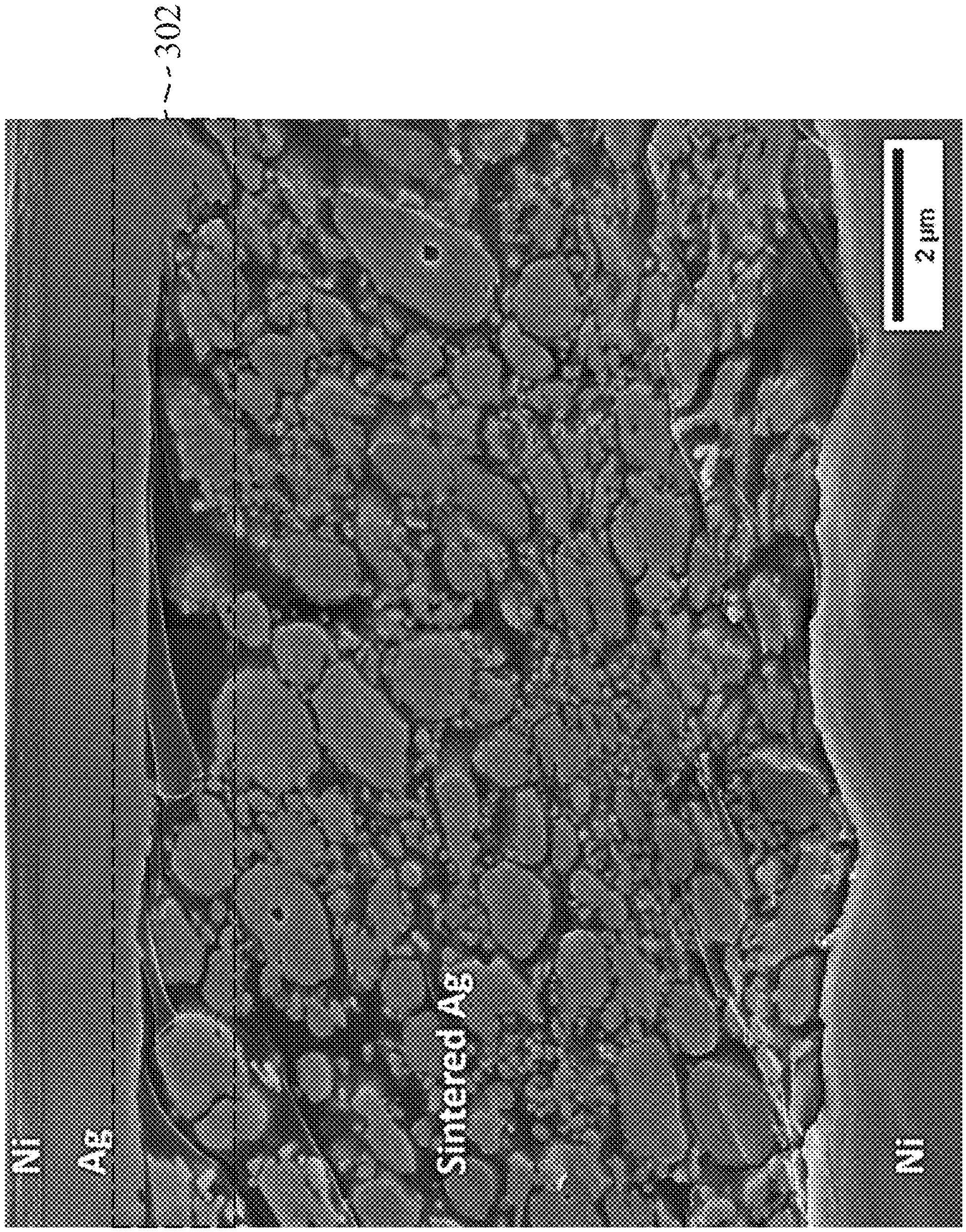
FIG. 12 is a FIB image showing a cross-sectional view of a SiC/Ti/Ni/Ag structure.

FIG. 12 is a FIB image showing a cross-sectional view of a SiC/Ti/Ni/Ag structure after die bonding. The SiC/Ti/Ni/Ag structure was bonded with the silver paste (as the sintering layer 108) and the DBC ceramic substrate (as the carrier substrate 110) in a vacuum, and the sintering was performed under a pressure of 10 MPa and at a bonding temperature of 250° C. The SiC/Ti/Ni/Ag structure is another example of the die bonding structure 200 in FIG. 5, in which the chip 102 was silicon carbide (SiC), the adhesive layer 104 was titanium (Ti), the diffusion barrier layer 202 was nickel (Ni), and the equi-axial coarse grain layer 204 was silver (Ag). Note that due to the absence of silver nanocrystalline in the Comparative Example 2 (e.g., the nano-twinned layer 106 in FIG. 4), the silver in the equi-axial coarse grain layer 204 will not diffuse into the sintered layer 108 (as shown in block 302) during die bonding, so that the bonding force between the equi-axial coarse grain layer 204 and the sintered layer 108 was poor.

Example 2: SiC/Ti/Nt-Ag Structure

Figure 13:
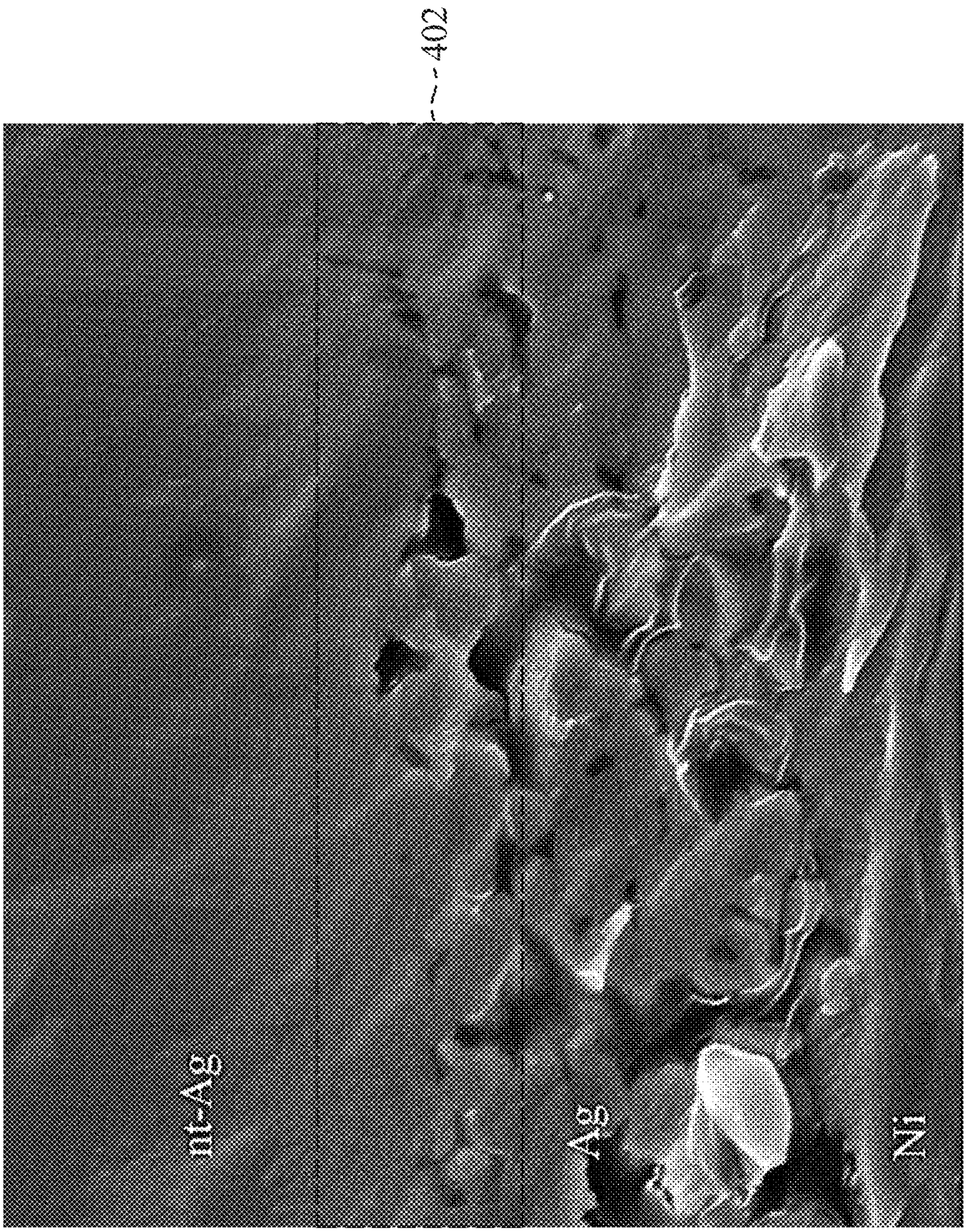
FIG. 13 is a FIB image showing a cross-sectional view of a SiC/Ti/nt-Ag structure, in accordance with other embodiments.

FIG. 13 is a FIB image showing a cross-sectional view of a SiC/Ti/nt-Ag structure after die bonding, in accordance with some embodiments. The SiC/Ti/nt-Ag structure was bonded with the silver paste (as the sintering layer 108) and the DBC ceramic substrate (as the carrier substrate 110) in a vacuum, and the sintering was performed under a pressure of 10 MPa and at a bonding temperature of 250° C. The SiC/Ti/nt-Ag structure is another example of the die bonding structure 100 in FIG. 4, in which the chip 102 was silicon carbide (SiC), the adhesive layer 104 was titanium (Ti), and the nano-twinned layer 106 was silver (Ag). Note that due to the high diffusion rate characteristics of the silver nano-twinned structure in Example 2 (e.g., the nano-twinned layer 106 in FIG. 4), the nano-twinned layer 106 is diffused into the sintered layer 108 to promote the sintering reaction at the interface (as shown in block 402) during die bonding, so that the bonding force between the nano-twinned layer 106 and the sintered layer 108 was improved.

Figure 14:
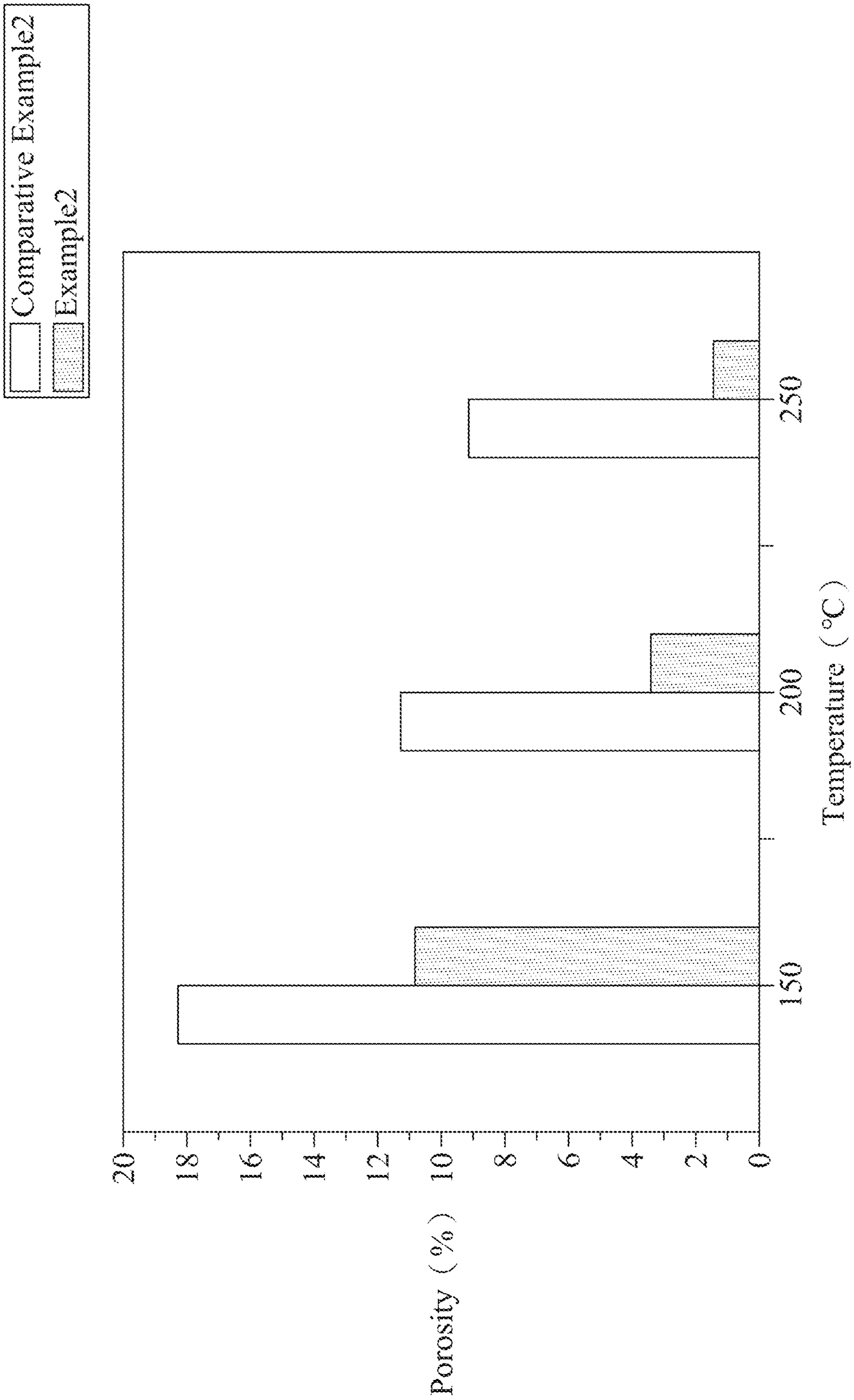
FIG. 14 is a diagram showing binding temperature versus porosity of Ag sintered joints, in accordance with other embodiments.

As shown in FIG. 14, Example 2 demonstrated a significant reduction in the porosity of Ag sintered joints compared to Comparative Example 2. For the low temperature die bonding at 150° C., the porosity decreased from 18.4% to 10.9%. Surprisingly, the Ag sintered porosity can be reduced to an extremely low value of 1.2% after die bonding at 250° C. by using the nano-twinned layer 106.

[Bonding Strength Measurement]

The structures of Comparative Example 2 and Example 2 as described above were used to measure the bonding strength using a welding strength tester (DAGE 4000) manufactured by Nordson. The results are shown in Table 3 and FIG. 15.

TABLE 3

| | Bonding strength (MPa) | | |
|---|---|---|---|
| Temperature | 150° C. | 200° C. | 250° C. |
| Comparative Example 2 | 11.0 | 15.3 | 19.9 |
| Example 2 | 18.9 | 20.5 | 38.8 |

Figure 15:
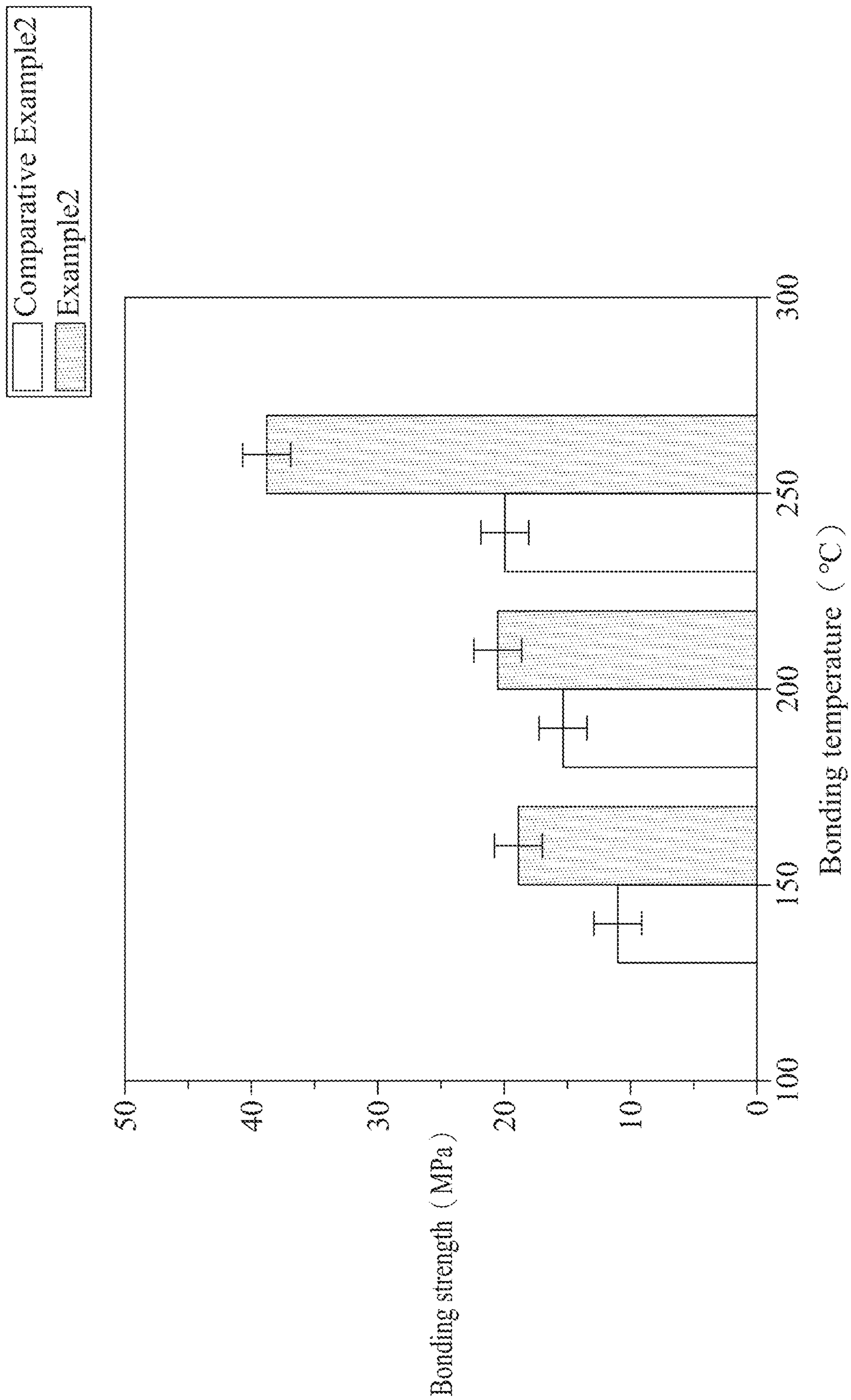
FIG. 15 is a diagram showing binding temperature versus bonding strength, in accordance with other embodiments.

According to Table 3 and FIG. 15, after sintering at various bonding temperatures (such as 150° C., 200° C., and 250° C.), Example 2 (SiC/Ti/nt-Ag) has better bonding strength than Comparative Example 2 (SiC/Ti/Ni/Ag). In other words, the die bonding structure 100 with the nano-twinned layer 106 has better bonding strength than the die bonding structure 200 with the equi-axial coarse grain layer 204 at various bonding temperatures.

It should be noted that after sintering the structure of Comparative Example 2 at a bonding temperature of 150° C., its bonding strength was too low for practical use; on the contrary, the structure of Example 2 was nearly 20 MPa. In addition, after sintering the structures of Comparative Example 2 and Example 2 at a bonding temperature of 250° C., the bonding strength of Example 2 was almost twice that of Comparative Example 2.

Comparative Example 3: Si/Ti/Ni/Cu Structure

The Si/Ti/Ni/Cu structure is a further example of the die bonding structure 200 in FIG. 5, in which the chip 102 was silicon (SiC), the adhesion layer 104 was titanium (Ti), the diffusion barrier layer 202 was nickel (Ni), and the equi-axial coarse grain layer 204 was copper (Cu).

Example 3: Si/Ti/Nt-Cu Structure

The Si/Ti/nt-Cu structure is a further example of the die bonding structure 100 in FIG. 4, in which the chip 102 was silicon (SiC), the adhesion layer 104 was titanium (Ti), and the nano-twinned layer 106 was copper (Cu).

[Bonding Strength Measurement]

The structures of Comparative Example 3 and Example 3 as described above were respectively bonded with the silver paste (as the sintering layer 108) and the direct bond copper (DBC) ceramic substrate in a vacuum, and the sintering was performed under a pressure of 15 MPa or not and at various bonding temperatures (such as 150° C., 200° C., and 250° C.). After die bonding, the bonding strength was measured using a welding strength tester (DAGE 4000), manufactured by Nordson. The results with the application of 15 MPa of pressure are shown in Table 4 and FIG. 16, while the results without pressure applied are shown in Table 5 and FIG. 17.

TABLE 4

| | Bonding strength (MPa) | | |
|---|---|---|---|
| Temperature | 150° C. | 200° C. | 250° C. |
| Comparative Example 3 | 15.88 | 28.67 | 32.33 |
| Example 3 | 17.02 | 31.79 | 39.84 |

TABLE 5

| | Bonding strength (MPa) | | |
|---|---|---|---|
| Temperature | 150° C. | 200° C. | 250° C. |
| Comparative Example 3 | 10.00 | 18.16 | 20.22 |
| Example 3 | 10.74 | 18.62 | 21.70 |

Figure 16:
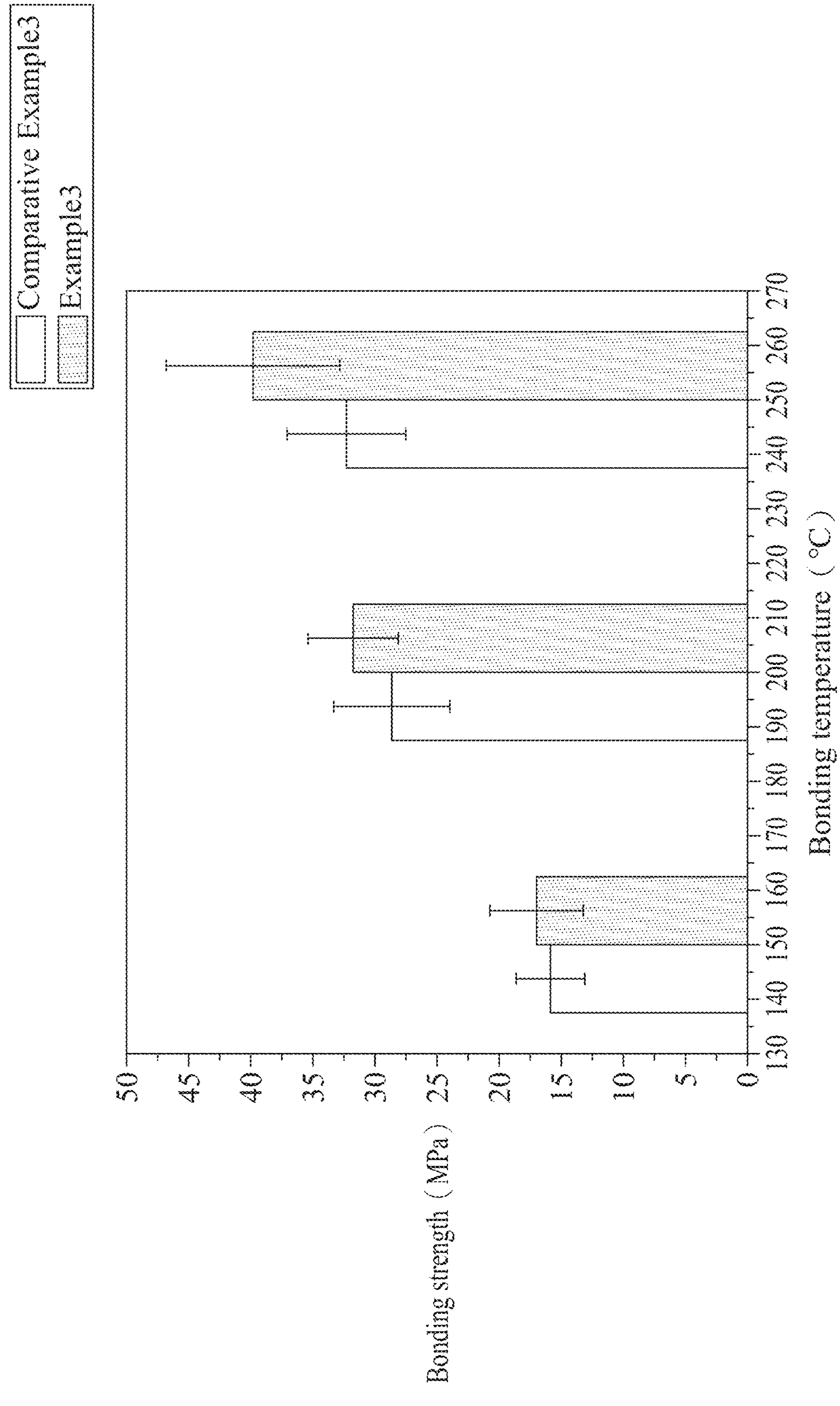
FIGS. 16-17 are diagrams showing binding temperature versus bonding strength, in accordance with further embodiments.
Figure 17:
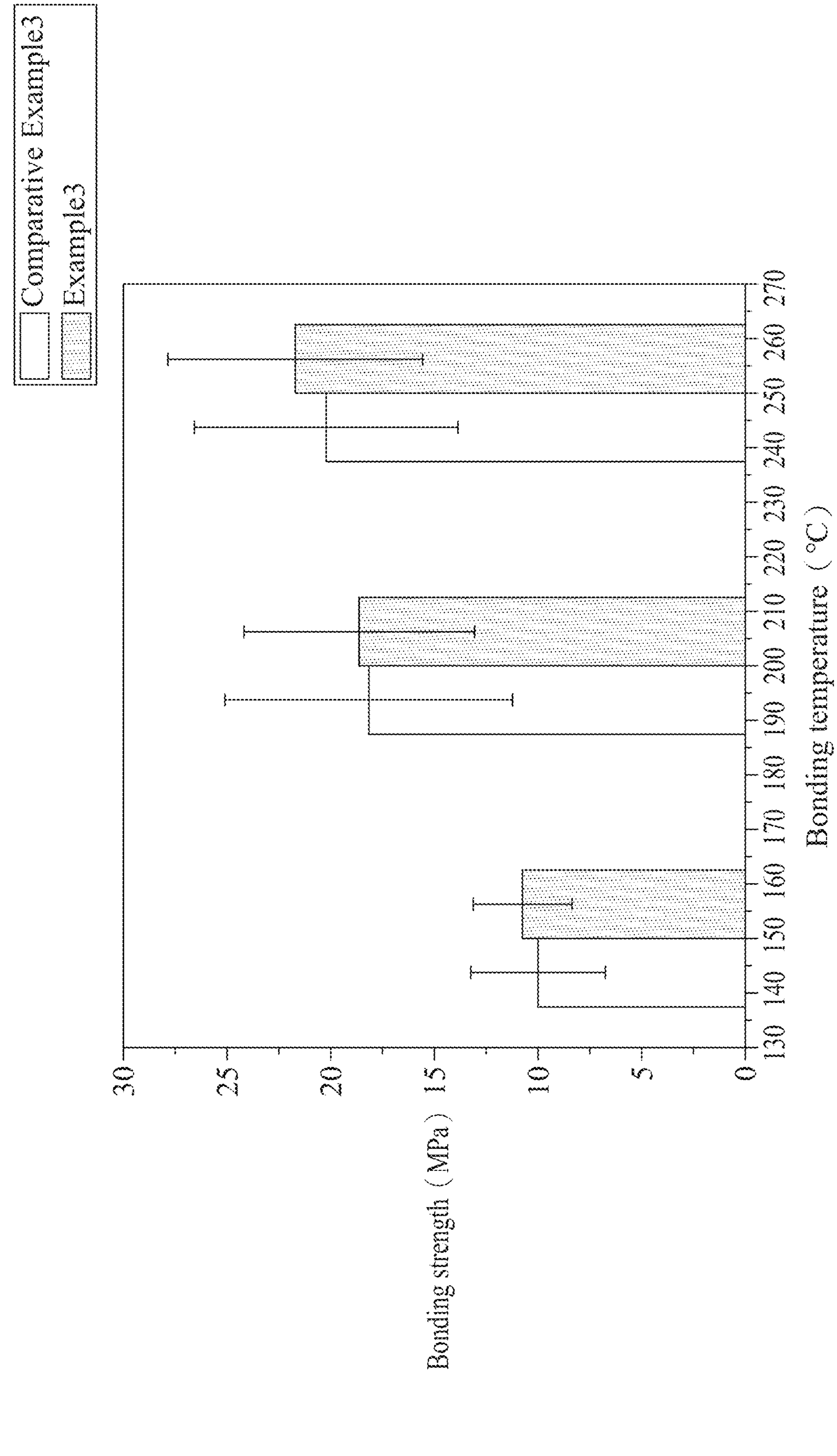

According to Table 4, Table 5, FIG. 16, and FIG. 17, after sintering at various bonding temperatures (such as 150° C., 200° C., and 250° C.) in a vacuum, Example 3 (Si/Ti/nt-Cu) has better bonding strength than Comparative Example 3 (Si/Ti/Ni/Cu), whether a pressure of 15 MPa is applied or not. In other words, the die bonding structure 100 with the nano-twinned layer 106 has better bonding strength than the die bonding structure 200 with the equi-axial coarse grain layer 204 at various bonding temperatures.

Embodiments of the present disclosure have several advantageous features. The adhesive layer located between the chip and the nano-twinned layer provides a better bonding force for preventing the nano-twinned layer from peeling from the chip and has a lattice buffering effect to prevent the impact of the lattice of the chip on the growth of the silver nano-twinned structure. The present disclosure provides a die bonding structure having a nano-twinned layer, which utilizes the high diffusion rate of (111) crystal orientation of the nano-twinned to indirectly promote the progress of interface sintering reaction to assist silver- or copper-sintered die bonding for the power IC modules and the high-power LED packaging. Not only can decrease the bonding temperature as the nano-twinned direct bonding, but the bonding strength can be increased. Meanwhile, the interface cracking problem of nano-twinned direct bonding is avoided due to the presence of the sintered layer. In addition, undesired diffusion caused by high temperatures can be avoided, so that the diffusion barrier layer can be omitted between the adhesive layer and the nano-twinned layer while preventing the possibility of a poor bonding force between the nano-twinned layer and the diffusion barrier layer at the same time.

While the present disclosure has been described by way of example and in terms of the preferred embodiments, it should be understood that the present disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A die bonding structure, comprising:

a carrier substrate;

a sintered layer on the carrier substrate;

a nano-twinned layer on the sintered layer, wherein a surface of the nano-twinned layer has crystal orientation with a density greater than 80%, wherein the nano-twinned layer comprises parallel-arranged twin boundaries, the parallel-arranged twin boundaries comprise more than 40% [111] crystal orientation, and a spacing between the parallel-arranged twin boundaries is 10 to 100 nm;

an adhesive layer on the nano-twinned layer; and a chip on the adhesive layer.

2. The die bonding structure of claim 1, wherein the carrier substrate comprises a metal heat sink, a printed circuit board (PCB) having a copper circuit layer and a protective layer thereon, or a ceramic substrate having the copper circuit layer and the protective layer thereon.

3. The die bonding structure of claim 2, wherein the protective layer comprises an organic solderability preservative (OSP) layer or a metal film.

4. The die bonding structure of claim 3, wherein the metal film comprises Ni, Ni/Pd, Ni/Au, or Ni/Pd/Au.

5. The die bonding structure of claim 2, wherein the ceramic substrate comprises aluminum oxide ($Al_2O_3$), aluminum nitride (AlN), or silicon nitride ($Si_3N_4$).

6. The die bonding structure of claim 2, wherein the metal heat sink comprises aluminum or copper.

7. The die bonding structure of claim 1, wherein the sintered layer comprises silver, copper, or a silver-copper composite.

8. The die bonding structure of claim 1, wherein the nano-twinned layer comprises silver, copper, or silver-copper alloy.

9. The die bonding structure of claim 1, wherein a thickness of the nano-twinned layer is 0.1 um to 100 um.

10. The die bonding structure of claim 1, wherein the adhesive layer comprises titanium, aluminum titanium, chromium, or titanium tungsten.

11. The die bonding structure of claim 1, wherein a thickness of the adhesive layer is 0.01 um to 0.5 um.

12. The die bonding structure of claim 1, wherein the chip comprises an integrated circuit (IC) chip or a light-emitting diode (LED) chip.

13. The die bonding structure of claim 1, wherein the chip comprises a single crystal: silicon (Si), germanium (Ge), silicon carbide (SiC), sapphire, arsenic gallium (GaAs), or gallium nitride (GaN).

14. The die bonding structure of claim 1, wherein the adhesive layer is in direct contact with the nano-twinned layer.

15. A method of manufacturing a die bonding structure, comprising:

providing a chip;

forming an adhesive layer on the chip;

forming a nano-twinned layer on the adhesive layer, wherein a surface of the nano-twinned layer has [111] crystal orientation with a density greater than 80%, wherein the nano-twinned layer comprises parallel-arranged twin boundaries, the parallel-arranged twin boundaries comprise more than 40% [111] crystal orientation, and a spacing between the parallel-arranged twin boundaries is 10 to 100 nm; and performing a bonding process to bond the nano-twinned layer to a carrier substrate through a sintered layer.

16. The method of claim 15, wherein performing the bonding process comprises:

disposing a sintering material on the carrier substrate; and attaching the nano-twinned layer to the sintering material and heating the sintering material to form the sintered layer.

17. The method of claim 15, wherein performing the bonding process comprises:

disposing a sintering material on the nano-twinned layer; and attaching the carrier substrate to the sintering material and heating the sintering material to form the sintered layer.

18. The method of claim 16, wherein the sintering material is a silver paste, a copper paste or a copper paste covered with silver.

19. The method of claim 15, wherein the bonding process is performed under a pressure of 5 MPa to 30 MPa and at a temperature of 100° C. to 350° C.

20. The method of claim 15, wherein each of the adhesive layer and the nano-twinned layer is formed by sputtering, evaporation, or electroplating.

21. The method of claim 15, wherein the bonding process is performed under vacuum, a protective atmosphere, or an ambient atmosphere.

* * * * *